United States Patent [19]

Mueller et al.

[11] 4,174,535
[45] Nov. 13, 1979

[54] INTEGRATED CURRENT SUPPLY CIRCUIT

[75] Inventors: Ruediger Mueller, Munich; Michael Pomper, Schliersee; Ludwig Leipold, Munich, all of Fed. Rep. of Germany

[73] Assignee: Siemens Aktiengesellschaft, Berlin & Munich, Fed. Rep. of Germany

[21] Appl. No.: 932,498

[22] Filed: Aug. 10, 1978

[30] Foreign Application Priority Data

Sep. 9, 1977 [DE] Fed. Rep. of Germany ....... 2740763

[51] Int. Cl.² .......................... H02J 1/04; G05F 1/60
[52] U.S. Cl. ....................................... 363/147; 323/4; 323/22 R
[58] Field of Search ................ 363/147; 307/237, 297, 307/304; 323/1, 4, 22 R

[56] References Cited

U.S. PATENT DOCUMENTS

| | | | |
|---|---|---|---|
| 3,916,220 | 10/1975 | Roveti | 323/22 R X |
| 3,983,473 | 9/1976 | Sanderson | 323/22 R |
| 4,004,164 | 1/1977 | Cranford, Jr. et al. | 323/22 R X |
| 4,004,244 | 1/1977 | Schade, Jr. | 323/4 X |
| 4,005,353 | 1/1977 | Yokoyama | 323/22 R |
| 4,015,146 | 3/1977 | Aihara et al. | 307/304 |
| 4,020,367 | 4/1977 | Yamashiro et al. | 323/22 R X |
| 4,031,456 | 6/1977 | Shimada et al. | 323/4 |

OTHER PUBLICATIONS

"Negative Resistance Shown in Dual FET Device," Electronics International, Apr. 18, 1974.

Primary Examiner—J. D. Miller
Assistant Examiner—Peter S. Wong
Attorney, Agent, or Firm—Hill, Van Santen, Steadman, Chiara & Simpson

[57] ABSTRACT

An integrated current supply circuit is disclosed which utilizes a sub-circuit having a lambda-like current-voltage curve. Such a sub-circuit comprises a first field effect transistor whose source-drain path is connected to a series circuit formed from a load element and a second field effect transistor. The gate of the first field effect transistor is connected to the connection point of the load element and the second field effect transistor. A gate of the second FET leads either directly or via a voltage divider to the drain-side terminal of the series circuit. A capacitor is provided which is connected across output terminals of the circuit. The series circuit of the lambda sub-circuit is connected in parallel with input terminals, and the first FET connects between one of the input terminals and one of the output terminals.

12 Claims, 9 Drawing Figures

INTEGRATED CURRENT SUPPLY CIRCUIT

BACKGROUND OF THE INVENTION

The invention relates to an integrated current supply circuit having a sub-circuit with a lambda-like current-voltage curve.

A device of this kind has already been proposed in the German Patent application P26 38 086.9 of Karl-Ulrich Stein corresponding to U.S. Ser. No. 825,146 filed Aug. 16, 1977, and incorporated herein by reference, in which a sub-circuit is described which possesses a lambda-like current-voltage curve. This sub-circuit is designed as a dipole whose terminals correspond to the end-side terminals of the series circuit. This dipole, in series with the capacitor, is connected to an AC voltage source, and the terminals of the capacitor simultaneously form a circuit output which leads to a circuit to be supplied with DC.

SUMMARY OF THE INVENTION

An object of the invention is to improve upon the circuit described above with respect to improved operating reliability and lower power consumption.

This is achieved by providing an integrated current supply having a sub-circuit with a lambda-like current-voltage curve and wherein an input of the current supply circuit is connected in parallel with a series circuit of the sub-circuit and a first field effect transistor of the sub-circuit has its drain-source path connected between an input terminal and one of the terminals of the capacitor.

The advantage which can be achieved by the invention consists, in particular, in that the mode of operation of the current supply circuit is largely independent of the magnitude of the input impedance of the circuit to be supplied with DC, and that even at high-ohmic values of this input impedance, the current which charges the capacitor is interrupted in dependence upon the amplitude of the voltage connected to the current supply circuit at its input, so that the power loss of the current supply circuit can be kept low.

DESCRIPTION OF THE PREFERRED EMBODIMENTS

Figure 1:
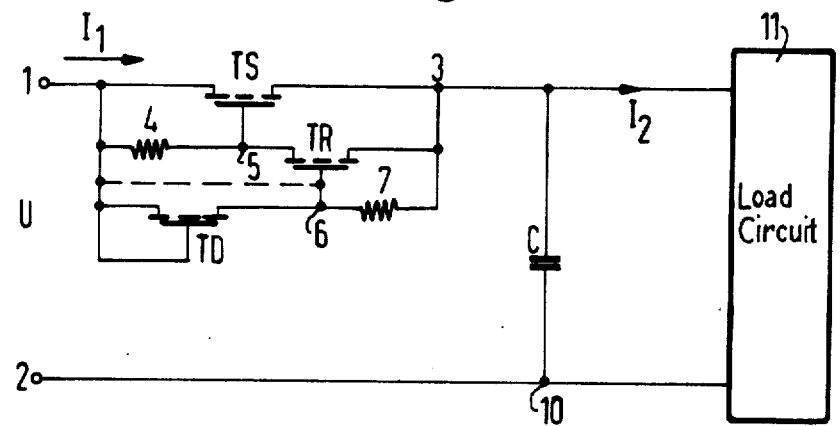
FIG. 1 is a fundamental circuit diagram of the current supply circuit of the previous application Ser. No. 825,146.

The integrated current supply circuit illustrated in FIG. 1 has a circuit input comprising the terminals 1 and 2 which are supplied with a voltage U. A sub-circuit which is interposed as a dipole between the terminal 1 and the circuit point 3 consists of a first field effect transistor TS of the enhancement type whose source-drain path is connected in parallel with a first series circuit which consists of the source-drain path of a second field effect transistor TR of the enhancement type and of a load element 4. The gate of the field effect transistor TS is connected to the connection point 5 of the series circuit TR, 4, whereas the gate of the field effect transistor TR leads to the connection point 6 of a further series circuit which consists of two resistance elements 7 and TD and is connected in parallel by its end-side terminals to the first series circuit TR, 4. Here TD signifies a field effect transistor of the enhancement type which is connected as load element and whose gate is connected to the end-side terminals of both series circuits which are connected to the input terminal 1.

Figure 2:
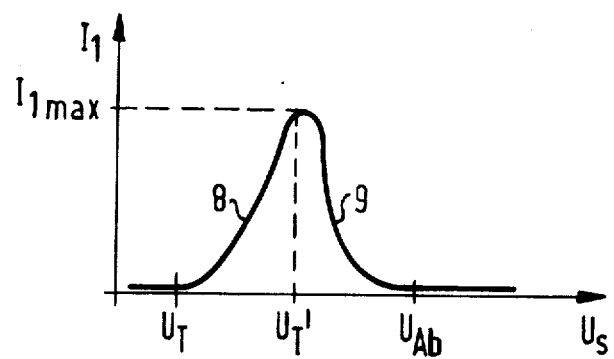
FIG. 2 shows the current-voltage curve of a sub-circuit from FIG. 1.

If the current flowing into the circuit at 1 is referenced $I_1$, and the voltage measured between the points 1 and 3 is referenced $U_s$, a dependence corresponding to the curve illustrated in FIG. 2 occurs between these values. Accordingly at low values of $U_s$ the two field effect transistors TS and TR are blocked until the start voltage $U_T$ of TS is reached. Above $U_T$, the curve $I_1/U_s$ develops a rising leg 8 which, having reached a voltage value $U_T'$ and having overshot a maximum current value $I_{1max}$, then develops into a falling leg 9. The current $I_1$ is finally interrupted with a disconnect voltage $U_{Ab}$. The leg 9 of the curve can be explained by the fact that when $U_T'$ is overshot, the field effect transistor TR which is blocked at low voltages $U_s$ passes into the conductive state and, together with the load element 4, represents an inverter which, via its output 5, increasingly reduces the voltage across the gate of the field effect transistor TS with a rising voltage $U_s$. In the case of the illustrated current voltage curve in FIG. 2 one speaks of a lambda form. The function of the series circuit formed from the elements TD and 7 is to divide the voltage $U_s$, and the sub-voltage tapped at the circuit point 6 is fed to the gate of the field effect transistor TR. Therefore in spite of structurally dependent equal start voltages of the field effect transistors TS and TR, the latter is switched on at the voltage $U_T'$ represented in FIG. 2. If the field effect transistors TS and TR possess structurally dependent differing start voltages having the values $U_T$ and $U_T'$, the voltage divider circuit TD,7 can also be dispensed with and replaced by a connection between the gate of TR and the circuit point 1, as illustrated in broken lines in FIG. 1.

The current $I_1$ which occurs in pulsed form in accordance with FIG. 2 charges a capacitor C which is itself discharged via an application or load circuit 11 connected to its terminals 3 and 10. Here the application or load circuit 11 is supplied with a DC $I_2$.

Figure 3:
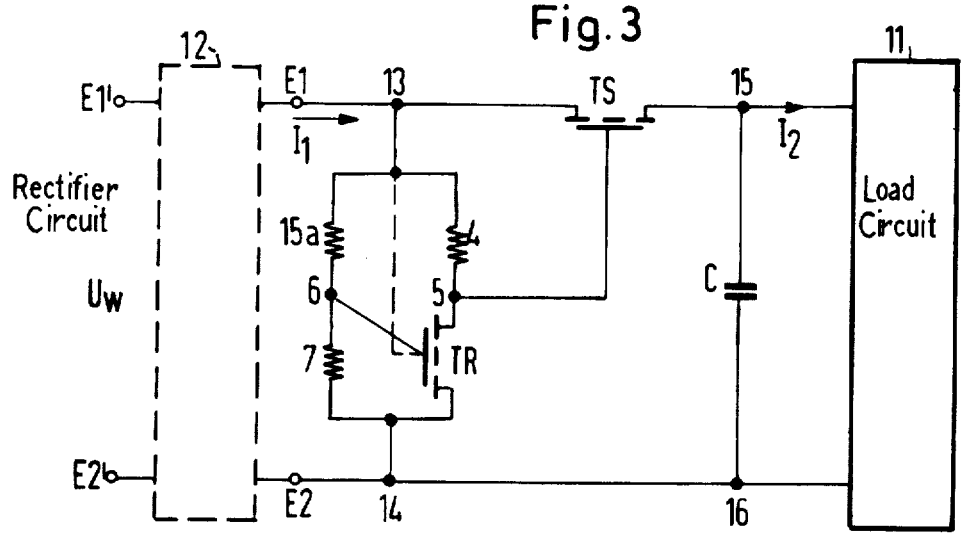
FIG. 3 is the fundamental circuit diagram of a first preferred embodiment of the invention.

In the exemplary embodiment of the invention illustrated in FIG. 3, a voltage U connected to the circuit input E1, E2 is fed to the end-side terminals of the series circuit TR,4 which are referenced 13 and 14 in FIG. 3 and the following Figures. Here the series circuit 7, 15, which acts as a voltage divider, corresponds to the series circuit illustrated in FIG. 1 composed of the components 7 and TD, with the difference that the field effect transistor TD connected as a load element has been replaced by a more general resistance symbol referenced 15a. Other details already explained with reference to FIG. 1 bear the same references in FIG. 3.

The terminals of the capacitor C are referenced 15 and 16.

In contrast to FIG. 1, in FIG. 3 the series circuit composed of the field effect transistor TR and the load element 4 is arranged in parallel with the circuit input E1, E2. The capacitor C is connected by its terminals 15 and 16 into connection between the source terminal of the first field effect transistor TS and the terminal 14 of the series circuit TR,4. Here the application or load circuit 11 is arranged in the source circuit of the field effect transistor TS. In place of the voltage $U_s$ which was defined as the voltage connected to the circuit points 1 and 3 in FIG. 1 and which controlled the field effect transistors TS and TR, the voltage U now occurs which is connected to the input E1, E2. Consequently the magnitude of the input impedance of the circuit 11, which was able to influence the voltage $U_s$ in FIG. 1, in FIG. 3 has no influence upon the behavior of the circuit. Whereas in FIG. 1, for example with a high-ohmic input impedance of the circuit 11, even at high values of the input voltage U the voltage division which was effected gave rise to a relatively low voltage $U_s$ which, for example, resulted in a maximum current $I_{1max}$ and thus a high power loss. In the circuit illustrated in FIG. 3, it is ensured that no current $I_1$ flows with input voltages which exceed the disconnection voltage $U_{Ab}$.

Figure 4:
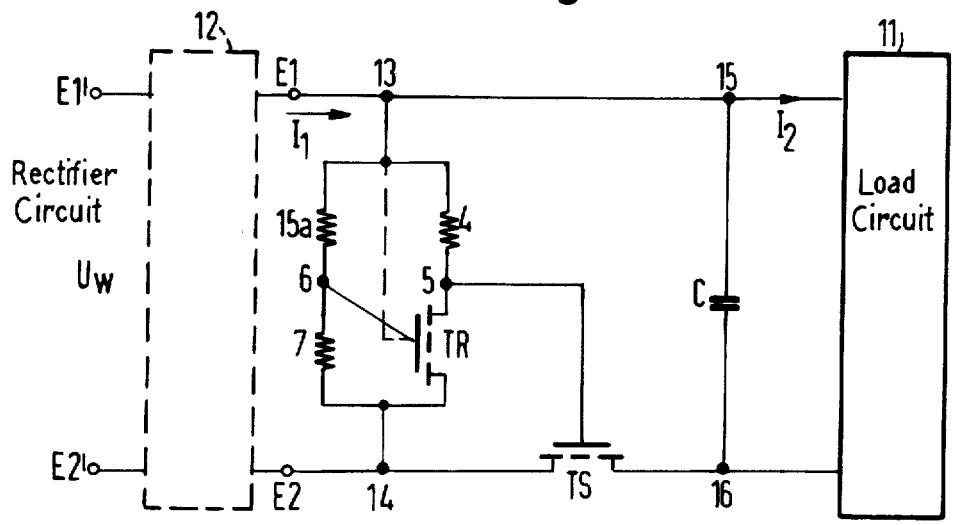
FIG. 4 is the fundamental circuit diagram of a second embodiment of the invention.

The only difference between the exemplary embodiment illustrated in FIG. 4 and that illustrated in FIG. 3 consists in that the capacitor C is connected by its terminals 15 and 16 between the drain terminal of the first field effect transistor TS and the terminal 13 of the series circuit TR,4.

Figure 5:
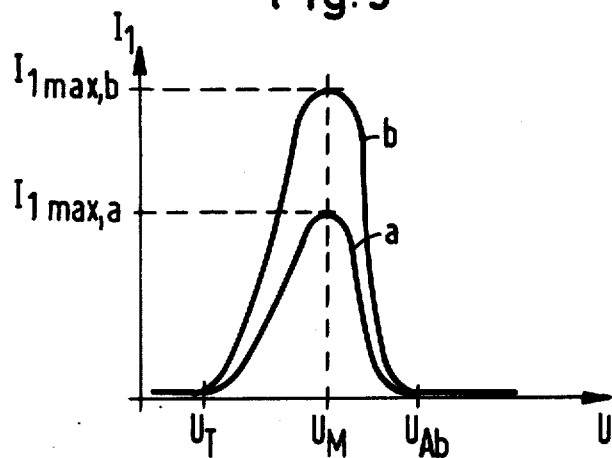
FIG. 5 shows current-voltage curves of sub-circuits of the embodiments corresponding to FIGS. 3 and 4.

The dependence of the current $I_1$ which flows into the circuit at E1 upon the voltage U which is connected at E1, E2 and which controls the field effect transistors TS and TR directly and independently of load, has been represented with respect to the exemplary embodiments illustrated in FIGS. 3 and 4 by the current-voltage curves which are illustrated in FIG. 5, the curve belonging to FIG. 3 being referenced a and that belonging to FIG. 4 being referenced b. As can be seen with the circuit illustrated in FIG. 3 in which the load lies in the source circuit of TS, a maximum current $I_{1max,a}$ is reached at a voltage value $U_M$ of the voltage U, whereas in the circuit illustrated in FIG. 4 in which the load 11 is located in the drain circuit of TS, a higher current $I_{max,b}$ is reached under identical conditions.

In the exemplary embodiments illustrated in FIGS. 3 and 4 it is expedient to precede the input E1, E2 of the current supply circuit by a rectifier arrangement 12, in particular a double-path rectifier or a bridge rectifier. The input of the rectifier arrangement 12 referenced E1' and E2' is then supplied with an AC voltage $U_W$, whereas the input E1, E2 is fed by the output of the arrangement 12 with a voltage U which consists of the rectified half waves of $U_W$.

Figure 6:
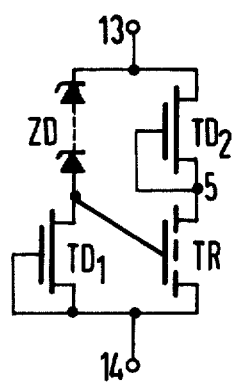
FIG. 6 illustrates a further development of a sub-circuit of the invention.

FIG. 6 illustrates a preferred embodiment of the series circuits arranged between the circuit points 13 and 14. Here the resistance element 7 consists of a field effect transistor $TD_1$ of the depletion type, whose gate is connected to a source terminal, whereas the load element 4 is formed similarly by a field effect transistor $TD_2$. The resistance element is designed as a series connection of a plurality of Zener diodes and is referenced ZD. As a result the disconnection voltage $U_{Ab}$ illustrated in FIG. 5 is clearly determined by the Zener voltage whereas in the circuitry design shown in FIGS. 3 and 4 it must be set by the resistance ratio of the resistance elements 7 and 15.

Figure 7:
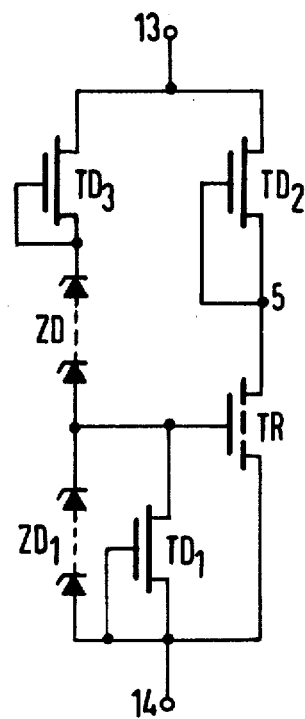
FIG. 7 illustrates another further development of the same sub-circuit of the invention.

The circuit illustrated in FIG. 6 can then, in accordance with FIG. 7, be designed for a high voltage U. For this purpose a further field effect transistor $TD_3$ of the depletion type is provided with a conductive connection between its gate and its source terminal in series to the Zener diode circuit ZD. Then a major part of the voltage U drops across the field effect transistor so that the other parts of the circuit are protected from excess voltages. In order to define the gate-source voltage across TR it is expedient to connect one or more than one Zener diode, referenced $ZD_1$ in FIG. 7, or other voltage-limiting elements, for example diodes poled in the forward direction, between the gate and the source terminal TR.

Figure 8:
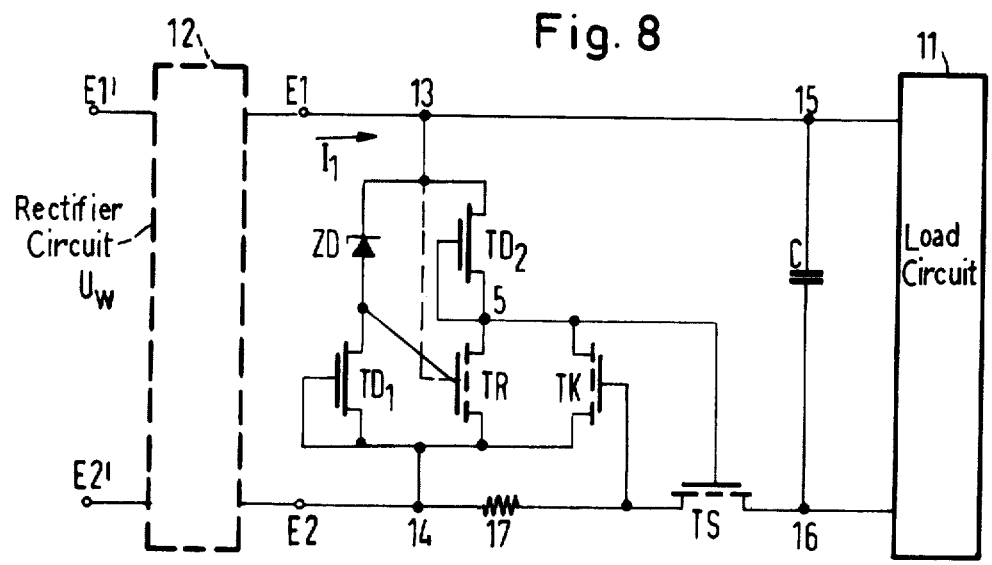
FIG. 8 illustrates a third embodiment of the invention.
Figure 9:
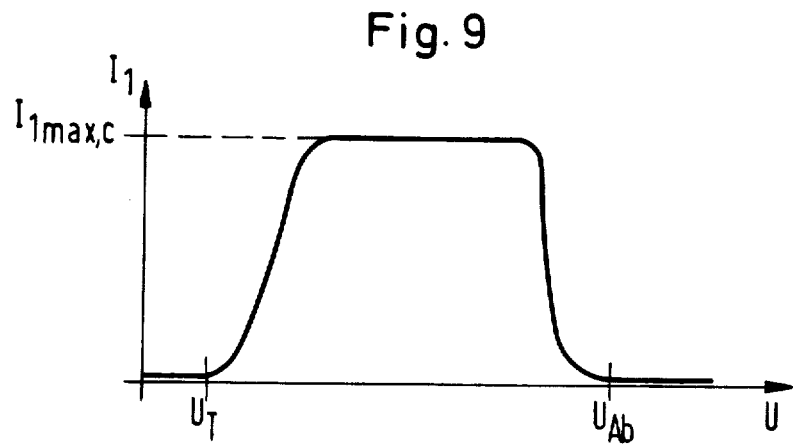
FIG. 9 shows the current-voltage curve of a sub-circuit of the embodiment corresponding to FIG. 8.

FIG. 8 illustrates another exemplary embodiment of the invention which proceeds from a circuit as shown in FIG. 4 and has series circuits designed in accordance with FIG. 6 located between the circuit points 13 and 14. In addition the source-drain path of a field effect transistor TK is connected in parallel with the source-drain path of the field effect transistor TR. Between the circuit point 14 and the source terminal of TS there is arranged a further resistance element 17 whose source end is connected to the gate of the field effect transistor TK. The additional circuit elements produce the effect of a negative feedback current which limits the current $I_1$ to a value of $I_{1max,c}$ within a large part of the path range $U_T$ to $U_{Ab}$. When $I_{1max,c}$ is overshot, the field effect transistor TK is further opened by the then increasing voltage drop across element 17 so that a reduction occurs in the gate voltage of TS which is oppositely directed to the increase of $I_1$.

The described exemplary embodiments of the current supply circuit corresponding to the invention apply to positive voltages U and are executed in the n-channel technique. However, circuits comprising p-channel transistors are equally suitable provided the voltage polarities are reversed accordingly.

The resistance elements characterized by a resistance symbol (provided these are not designed as field effect transistors of the depletion type with a conductive connection between the gate and the source terminal) can be constructed in any desired manner known to the expert. Thus, for example, they can be constructed as diffused or implanted resistance layers or the like. The circuit corresponding to the invention is particularly advantageously suitable for construction in the MOS technique, in which case it is expedient to integrate all the represented circuit components, including the application circuit 11, on a semiconductor chip, forming only the capacitor C as a connectable, external component.

Although various minor modifications may be suggested by those versed in the art, it should be understood that we wish to embody within the scope of the patent warranted hereon, all such embodiments as reasonably and properly come within the scope of our contribution to the art.

We claim as our invention:
1. An integrated current supply circuit comprising:
   (a) two input terminals;
   (b) two output terminals having a capacitor connected therebetween;
   (c) a lambda circuit means having a current voltage characteristic wherein a current through the circuit is low for a low applied voltage, said current rising to a maximum for a given applied voltage, and said current falling to a low value for higher applied voltages, said given applied voltage being between the low applied voltage and higher applied voltages;
(d) said lambda circuit means comprising
  (i) a first field effect transistor (FET) whose one end of a source-drain path connects to one end of a series circuit having a load element connected to a source-drain path of a second field effect transistor (FET), a gate of the first FET connecting between the load element and second FET,
  (ii) connection means connecting a gate of the second FET to a drain-side end of said series circuit;
(e) ends of series circuit being connected between said two input terminals;
(f) the other end of the first FET source-drain path connecting to one of said two output terminals; and
(g) the other of said two output terminals connecting to one of said two input terminals.

2. A current supply circuit of claim 1 in which said connection means comprises a voltage divider having first and second series connected elements, the gate of the second FET connecting between the elements and the voltage divider being connected in parallel with said series circuit.

3. A current supply circuit of claim 1 in which said connection means comprises a direct connection between the second FET gate and the drain-side end of said series circuit.

4. A current supply circuit as claimed in claim 1 in which the capacitor is connected between a source terminal of the first field effect transistor and a source-side end of the series circuit.

5. A current supply circuit as claimed in claim 1 in which the capacitor is connected between a drain terminal of the first field effect transistor and a drain-side end terminal of the series circuit.

6. A current supply circuit as claimed in claim 1 in which the input terminals have a rectifier arrangement connected therebetween.

7. A current supply circuit as claimed in claim 2 in which one of the voltage divider elements comprises a field effect transistor.

8. A current supply circuit as claimed in claim 2 characterized in that at least one of the divider elements has at least one Zener diode.

9. A current supply circuit as claimed in claim 8 in which one of the divider elements is connected to a drain-side end of the series circuit and has a series arrangement of a field effect transistor connected as a load element and at least one Zener diode.

10. A current supply circuit as claimed in claim 8 in which one of the divider elements is connected to a source-side end of the series circuit and has a parallel arrangement of a field effect transistor connected as a load element and at least one series connected Zener diode.

11. A current supply circuit as claimed in claim 1 in which a source-drain path of a third field effect transistor (FET) is connected parallel to the source-drain path of the second FET, and that a resistance element is provided between a source-side end of the series circuit and a source terminal of the first FET, and that a gate of the third FET is connected to the source terminal of the first FET.

12. A current supply circuit comprising:
(a) two input terminals and two output terminals;
(b) a capacitor connected between the two output terminals;
(c) a first field effect transistor (FET) having its source-drain path connected between one of the input terminals and one of the output terminals;
(d) a series circuit comprising a second field effect transistor (FET) and a load resistance, said series circuit being connected between the input terminals and a gate of the first FET connecting to a junction between the load resistance and second FET; and
(e) a voltage divider comprising first and second series connected elements, said voltage divider being connected in parallel with said series circuit and a gate of the second FET connecting at a junction between the first and second elements.

* * * * *